United States Patent
Hase et al.

(10) Patent No.: US 10,276,775 B2
(45) Date of Patent: Apr. 30, 2019

(54) VIBRATION DEVICE

(71) Applicant: Murata Manufacturing Co., Ltd., Nagaokakyo-shi, Kyoto-fu (JP)

(72) Inventors: Takashi Hase, Nagaokakyo (JP); Toshio Nishimura, Nagaokakyo (JP); Hiroaki Kaida, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 558 days.

(21) Appl. No.: 14/978,242

(22) Filed: Dec. 22, 2015

(65) Prior Publication Data

US 2016/0111627 A1    Apr. 21, 2016

Related U.S. Application Data

(63) Continuation of application No. PCT/JP2014/067757, filed on Jul. 3, 2014.

(30) Foreign Application Priority Data

Jul. 4, 2013    (JP) ................................ 2013-141092

(51) Int. Cl.
*H01L 41/09*    (2006.01)
*H01L 41/053*    (2006.01)
(Continued)

(52) U.S. Cl.
CPC ........ *H01L 41/053* (2013.01); *H01L 41/0933* (2013.01); *H02N 2/0055* (2013.01);
(Continued)

(58) Field of Classification Search
CPC .................................................. H01L 41/053
See application file for complete search history.

(56) References Cited

U.S. PATENT DOCUMENTS

| | | | |
|---|---|---|---|
| 2005/0142888 A1* | 6/2005 | Ebuchi | ..................... H03H 3/02 438/738 |
| 2010/0314969 A1* | 12/2010 | Gaidarzhy | ......... H03H 9/02338 310/321 |
| 2012/0092082 A1 | 4/2012 | Hentz | |

FOREIGN PATENT DOCUMENTS

| | | |
|---|---|---|
| JP | H08-196467 A1 | 7/1996 |
| JP | H10-117120 A | 5/1998 |

(Continued)

OTHER PUBLICATIONS

International Search Report issued for PCT/JP2014/067757, dated Sep. 16, 2014.
(Continued)

*Primary Examiner* — Thomas M Dougherty
*Assistant Examiner* — Karen B Addison
(74) *Attorney, Agent, or Firm* — Arent Fox LLP

(57) ABSTRACT

A vibration device that includes a vibration portion, a support portion connected to the vibration portion, a bending-vibrating portion connected to the support portion, and a frame-shaped base portion connected to the bending-vibration portion and disposed so as to surround the vibration portion. The base portion defines a slit that extends in a first direction crossing a second direction in which the support portion extends from the vibration portion, the slit defining first and second fixed ends of the bending-vibrating portion and which are continuous with the base portion. A length between a portion of the bending-vibrating portion connected to the support portion to one of the first and second fixed ends of the bending-vibrating portion is in a range of $\lambda/8$ to $3\lambda/8$, where $\lambda$ denotes a wavelength of a bending vibration corresponding to a frequency of a characteristic vibration of the vibration portion.

22 Claims, 7 Drawing Sheets

(51) Int. Cl.
*H03H 9/02* (2006.01)
*H02N 2/00* (2006.01)
*H03H 9/24* (2006.01)

(52) U.S. Cl.
CPC ..... *H03H 9/02244* (2013.01); *H03H 9/02448* (2013.01); *H03H 2009/0244* (2013.01); *H03H 2009/02385* (2013.01); *H03H 2009/02511* (2013.01); *H03H 2009/2442* (2013.01)

(56) References Cited

FOREIGN PATENT DOCUMENTS

| | | |
|---|---|---|
| JP | 2001-168875 A | 6/2001 |
| JP | 2005-191958 A | 7/2005 |
| JP | 2009-290371 A | 12/2009 |
| JP | 2010-147875 A | 7/2010 |
| WO | WO 2010/110918 A1 | 9/2010 |
| WO | WO2010110918 * 9/2010 | ............... H03H 9/02 |

OTHER PUBLICATIONS

Written Opinion of the International Searching Authority issued for PCT/JP2014/067757, dated Sep. 16, 2014.

\* cited by examiner

VIBRATION DEVICE

CROSS REFERENCE TO RELATED APPLICATIONS

The present application is a continuation of International application No. PCT/JP2014/067757, filed Jul. 3, 2014, which claims priority to Japanese Patent Application No. 2013-141092, filed Jul. 4, 2013, the entire contents of each of which are incorporated herein by reference.

FIELD OF THE INVENTION

The present invention relates to a vibration device including a vibration portion and a support portion connected to the vibration portion to support the vibration portion.

BACKGROUND OF THE INVENTION

To date, vibration devices employing various modes of vibration have been used as resonators or other devices. In such vibration devices, the vibration portion requires a support that does not inhibit vibrations of the vibration portion.

In Patent Document 1 described below, a T-shaped support portion is connected to a center portion of the surface extending in a lengthwise direction of a vibration portion that vibrates in a length mode. The T-shaped support portion includes a first portion, which extends in a first direction, and a second portion, which is connected to a center portion of one side surface of the first portion and extends in a second direction perpendicular to the first direction. An end of the second portion is connected to the vibration portion. The other side surface of the first portion opposite to the side surface connected to the second portion faces a slit formed in a base portion. This slit extends in a direction in which the first portion extends.

In this T-shaped support portion, vibrations that have propagated from the second portion cause a portion of the first portion facing the slit to bend and vibrate. The portion of the first portion that bends and vibrates serves as a vibration reflection portion. The length of the vibration reflection portion, specifically, the length in the first direction is determined as a quarter of a wavelength λ of a main vibration that has propagated from the vibration portion.

In Patent Document 2 described below, a support portion is connected to a center portion of a surface of the vibration portion in a lengthwise direction of the vibration portion. A support frame disposed so as to surround the vibration portion is connected to the support portion. The support frame is held by a packaging member using an electrically conductive adhesive or the like. Thus, the support portion is prevented from being damaged. In addition, forming the support portion into shapes such as a letter T shape is described as enabling prevention of undesired transmission of vibrations.

Patent Document 1: International Publication No. WO2010/110918

Patent Document 2: Japanese Unexamined Patent Application Publication No. 10-117120

SUMMARY OF THE INVENTION

In the vibration device described in Patent Document 1, the length of the vibration reflection portion is determined as λ/4. Thus, vibrations fail to be confined and are likely to transmit to the base portion.

Moreover, the holding portions that are continuous with both ends of the first portion of the T-shaped support portion have a small area. Thus, the difference in acoustic impedance between the T-shaped support arms and the holding portions is too small to attain a sufficiently large acoustic reflection effect.

In the vibration device described in Patent Document 2, the relationship between the shape and dimensions of the support portion and the wavelength of vibrations excited by the vibration portion is not taken into consideration at all. This configuration thus fails to reduce undesired transmission of vibrations to a sufficiently small level.

An object of the invention is to provide a vibration device capable of securely confining vibrations of a vibration portion to the vibration portion.

A vibration device according to the present invention includes a vibration portion, a support portion, and a base portion. The support portion includes a first end and a second end opposite to the first end. The first end of the support portion is connected to the vibration portion. The support portion supports the vibration portion.

The base portion is coupled to the second end of the support portion. The base portion has such a frame shape as to surround the vibration portion. In this invention, a slit is formed in the base portion between the support portion and a portion of the base portion connected to the second end of the support portion so that a bending-vibrating portion having both ends serving as fixed ends can be formed. The slit extends in a direction crossing the direction in which the support portion extends.

In this invention, both ends of the bending-vibrating portion are continuous with the remaining portions of the base portion, which serve as the fixing ends of the bending-vibrating portion.

In this invention, the length from a portion of the bending-vibrating portion connected to the second end of the support portion to each fixed end of the bending-vibrating portion is determined as λ/4 where λ denotes the wavelength of a bending vibration corresponding to a frequency of a characteristic vibration of the vibration portion.

In a specific aspect of a vibration device according to the invention, an entirety of the vibration device has a plate-shaped body and a plurality of through grooves that surround the vibration portion except for a portion at which the support portion is formed are formed in the plate-shaped body so as to define the vibration portion, the support portion, and the base portion.

In a specific aspect of a vibration device according to the invention, the vibration portion includes a Si layer made of a degenerate semiconductor and an excitation unit laminated on the Si layer, and the excitation unit includes a piezoelectric layer and a first electrode and a second electrode that apply a voltage to the piezoelectric layer.

In another specific aspect of a vibration device according to the invention, a distance between the periphery of the vibration portion and the base portion is equal to a distance between the periphery of the vibration portion and the bending-vibrating portion.

In another specific aspect of a vibration device according to the invention, a distance between the periphery of the vibration portion and the base portion is smaller than a distance between the periphery of the vibration portion and the bending-vibrating portion.

In the vibration device according to the present invention, both ends of the bending-vibrating portion are continuous with the remaining portions of the base portion, and the portions with which both ends are continuous serve as fixing ends. A sufficiently large acoustic reflection effect can thus be acquired. This configuration can thus securely reflect vibrations that have transmitted from the vibration portion to the vibration using vibrations of the bending-vibrating portion. Thus, vibrations can be securely confined to the vibration portion.

DETAILED DESCRIPTION OF THE PREFERRED EMBODIMENTS

Figure 1A:
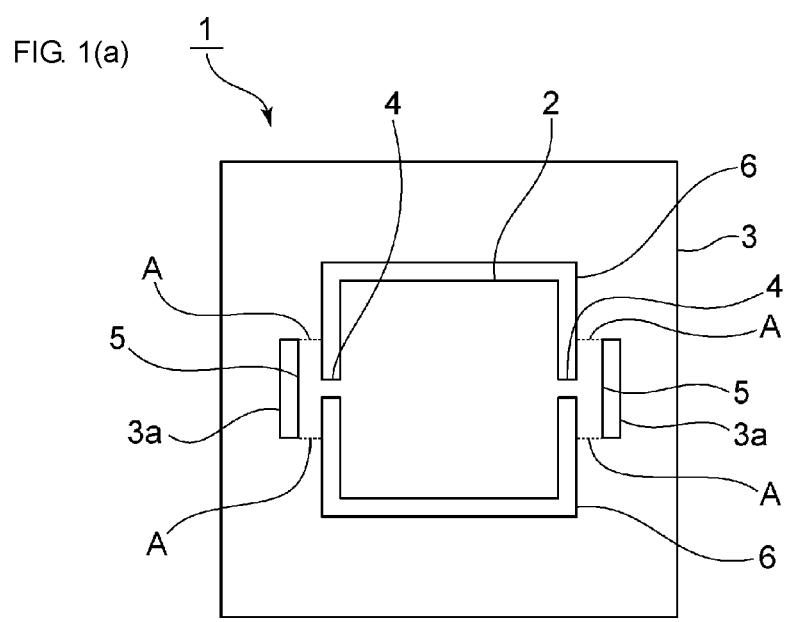
FIG. 1(a) is a plan view of a vibration device according to a first embodiment of the invention and FIG. 1(b) is a front cross-sectional view of a main portion of the vibration device.

Referring to the drawings, specific embodiments of the invention are described below to disclose the invention.

FIG. 1(a) is a plan view of a vibration device according to a first embodiment of the invention. A vibration device 1 includes a square-plate-shaped vibration portion 2. The vibration portion 2 is coupled to a frame-shaped base portion 3 using support portions 4. Although not particularly limited, the base portion 3 has a square-shaped periphery.

One of the support portions 4 is connected to a center portion of a first side surface of the square-plate-shaped vibration portion 2. The other support portion 4 is similarly connected to a second side surface opposite to the first side surface. In other words, a pair of support portions 4 are provided.

Each support portion 4 includes a first end connected to the vibration portion 2 and a second end connected to the base portion 3. The second end is located opposite to the first end.

The second end of each support portion 4 is connected to a corresponding one of bending-vibrating portions 5. The bending-vibrating portions 5 are portions formed by forming slits 3a and are disposed between the corresponding slits 3a and the corresponding support portions 4. Specifically, slits 3a that extend in a direction perpendicular to the direction in which the support portions 4 extend are formed in the base portion 3. In other words, slits 3a are formed so as to extend in a direction parallel to the side surfaces of the square-plate-shaped vibration portion 2 to which the support portions 4 are connected.

Portions of the base portion located between the slits 3a and the support portions 4 constitute the bending-vibrating portions 5. The outer edge of each bending-vibrating portion 5 faces the corresponding slit 3a. The opposite edge faces a corresponding one of through grooves 6. The vibration portion 2 and the support portions 4 can be formed by forming the pair of through grooves 6 in the square-plate-shaped base portion 3.

In other words, the vibration portion 2 is surrounded by the frame-shaped base portion 3 with the through grooves 6 interposed therebetween. Thus, the distance between the periphery of the vibration portion 2 and the base portion 3 is determined to be equal to the distance between the periphery of the vibration portion 2 and each bending-vibrating portion 5.

As illustrated in FIG. 1(a), the bending-vibrating portions 5 extend in the direction in which the slits 3a extend. The positions drawn with broken lines A in FIG. 1(a) are ends of the bending-vibrating portions 5. Specifically, the lengthwise ends of each bending-vibrating portion 5 coincide with the lengthwise ends of the slit 3a corresponding to the bending-vibrating portion 5. In other words, a portion between each slit 3a and the through grooves 6 constitutes the corresponding bending-vibrating portion 5.

Figure 1B:
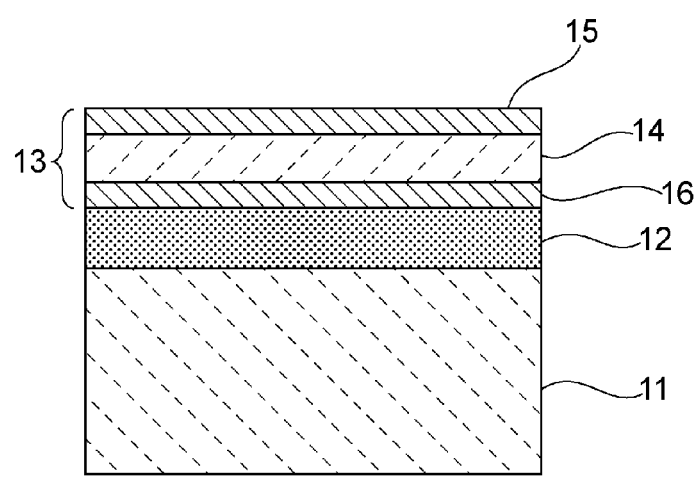

In this embodiment, the vibration portion 2 has a multilayer structure illustrated in FIG. 1(b). As illustrated in FIG. 1(b), a silicon oxide layer 12 is laminated on a Si layer 11 made of a degenerate semiconductor.

The Si layer 11 made of a degenerate semiconductor is formed into a degenerate semiconductor by doping an n-type dopant into Si. The concentration of this doping is determined to be greater than or equal to $5 \times 10^{19}$ pcs/cm$^3$. The above-described dopant is not limited to a particular substance but phosphorus (P) is preferably used as an n-type dopant. Use of phosphorus (P) facilitates manufacture of an n-type degenerate semiconductor.

An excitation portion 13 is laminated on the silicon oxide layer 12. The excitation portion 13 includes a piezoelectric thin film 14, a first electrode 15 laminated over a substantially entire upper surface of the piezoelectric thin film 14, and a second electrode 16 laminated over a substantially entire lower surface of the piezoelectric thin film 14. Here, these electrodes may have a slit or cutout.

The piezoelectric thin film 14 is oriented in a thickness direction. Thus, an application of an alternating electric field between the first electrode 15 and the second electrode 16 excites the excitation portion 13. As described above, the Si layer 11 is made of Si of a degenerate semiconductor. The vibration portion 2 is thus a vibrator having a so-called microelectromechanical system (MEMS) structure.

When the excitation portion 13 is excited, the square-plate-shaped vibration portion 2 vibrates in a mode in which a square plate expands. This vibration characteristic is usable in the vibration device 1.

A portion that moves a minimum distance during the vibrations in which the square plate expands is positioned at the center of each of the four side surfaces. In this embodiment, each support portion 4 is connected to the center of one side surface, that is, the portion that moves a minimum distance. Thus, the vibrations of the vibration portion 2 are less likely to be transmitted to the support portions 4. In addition, in this embodiment, vibrations can be securely confined to a region up to the bending-vibrating portions 5 by the effect of the bending-vibrating portions 5. Thus, the vibration characteristic can be enhanced. This effect is described below in detail.

In this embodiment, the direction in which the support portions 4 extend and the direction in which the bending-vibrating portions 5 extend are perpendicular to each other.

The inner edge of each bending-vibrating portion 5 faces the through grooves 6 and the outer edge of each bending-vibrating portion 5 faces the corresponding slit 3a. Thus, when vibrations are transmitted from the vibration portion 2 to the bending-vibrating portions 5 via the support portions 4, the bending-vibrating portions 5 bend and vibrate in a direction perpendicular to the direction of the surface of the base portion 3. In this case, both ends of each bending-vibrating portion 5 are fixed ends. Specifically, the ends are fixed ends because the ends of the bending-vibrating portions 5 drawn with the broken lines A are continuous with the base portion 3.

In this embodiment, transmitted vibrations are converted into vibrations of the bending-vibrating portions 5, and the interface between each bending-vibrating portion 5 and the base portion 3 serves as a fixed end of the bending vibration. The bending vibrations are thus reflected at the interface, whereby transmission of vibrations to the base portion 3 can be effectively prevented.

Particularly, since portions of the base portion on the outer side of the fixed ends drawn with the broken lines A have a large area, the acoustic impedance of the base portion 3 can be enhanced. Thus, the acoustic reflection efficiency at the portions drawn with the broken lines A can be enhanced. This configuration can thus enhance the property of confining vibrations to a region up to the bending-vibrating portions 5.

As described above, both ends, that is, the fixed ends of each bending-vibrating portion 5 are continuous with the remaining portions of the base portion. Thus, the portions of the base portion on the outer side of the fixed ends have a large area. In this case, a larger area of the portions of the base portion on the outer side of the fixed ends is more desirable. More specifically, the area of the remaining portions of the base portion on the outer side of the fixed ends of each bending-vibrating portion 5 is desirably larger than the area of the bending-vibrating portion 5.

Figure 2:
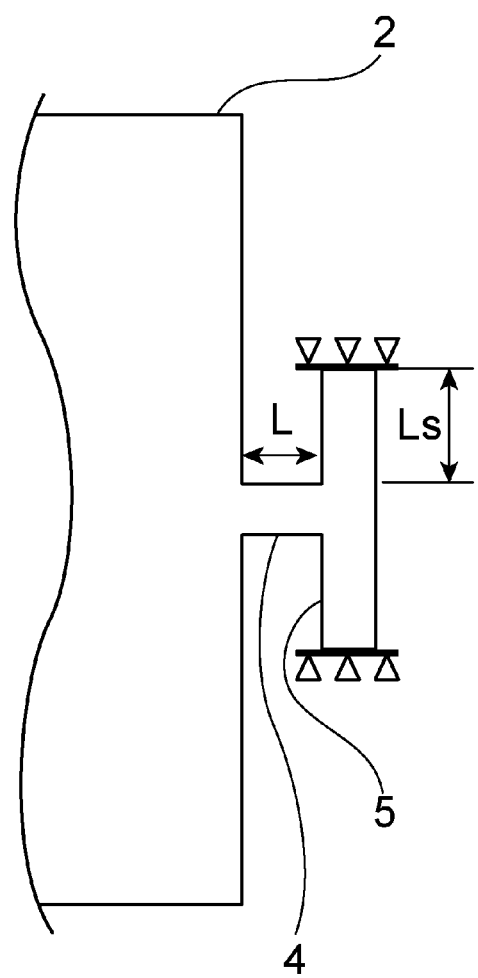
FIG. 2 is a partially cut plan view illustrating the dimensional relationship between a support portion and a bending-vibrating portion according to a first embodiment of the invention.

FIG. 2 is a partially cut plan view illustrating the dimensional relationship between one support portion and the corresponding bending-vibrating portion. FIG. 2 schematically illustrates both ends of each bending-vibrating portion 5 as fixed ends.

In this embodiment, the length Ls, which is a distance between a portion of each bending-vibrating portion 5 connected to the second end of the corresponding support portion 4 and one fixed end of the bending-vibrating portion 5, is $\lambda/4$ where $\lambda$ denotes the wavelength of a bending vibration corresponding to the frequency of the characteristic vibration of the vibration portion 2. This setting can also further enhance the property of confining vibrations.

As described above, in this embodiment, the portions of the base portion on the outer side of the fixed ends drawn with the broken lines A have a large area, whereby the acoustic reflection effect can be enhanced and the property of confining vibrations can be enhanced. Moreover, since the distance Ls is determined as $\lambda/4$, the property of confining vibrations can be more effectively enhanced. These effects are more specifically described with reference to FIGS. 6 and 7.

A vibration device 1 having the following specifications is fabricated as the above-described vibration device 1: the plane shape of the vibration portion 2 is 150 µm×150 µm;

the length L in a direction connecting the first end and the second end of each support portion 4 is 5 µm; the width of each support portion 4 is 5 µm;

the width of each bending-vibrating portion 5 is 5 µm;

the thickness of the Si layer 11 is 10 µm; the amount by which P, which is an n-type dopant, is doped in the Si layer is $5\times10^{19}$ pcs/cm$^3$; the thickness of the silicon oxide layer 12 is 0.8 µm; the piezoelectric thin film 14 is made of an aluminum nitride film having a thickness of 0.8 µm; and the first and second electrodes 15 and 16 are made of Mo having a thickness of 0.1 µm.

Figure 6:
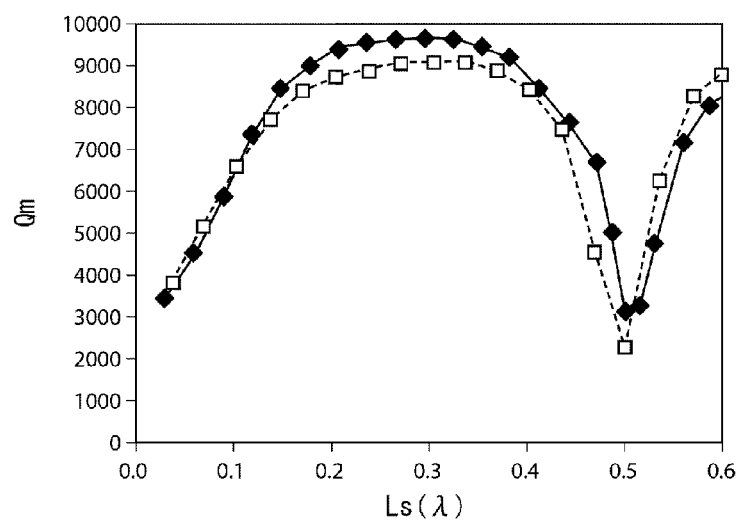
FIG. 6 is a graph illustrating the relationship between Qm and the length Ls between the portion of a bending-vibrating portion connected to a support portion and the outer fixed end of the bending-vibrating portion.
Figure 7:
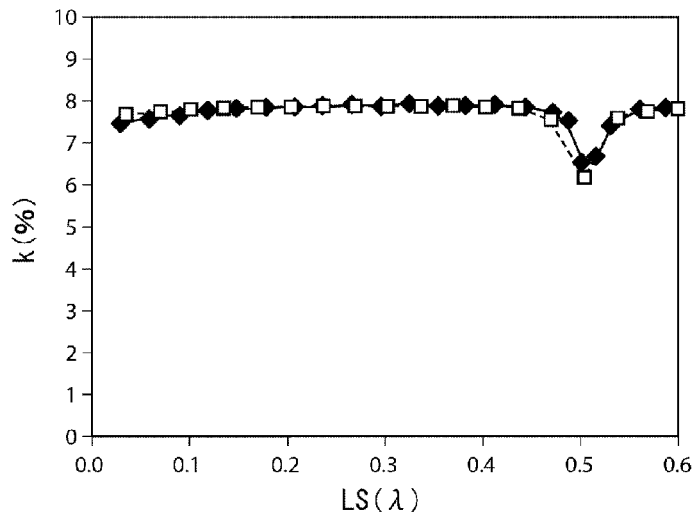
FIG. 7 is a graph illustrating the relationship between the critical coupling coefficient k (%) and the length Ls between the portion of the bending-vibrating portion connected to the support portion and the outer fixed end of the bending-vibrating portion.

In the above-described vibration device 1, the distance Ls described above is changed among various different values. FIG. 6 is a graph showing the relationship between the distance Ls and Qm of vibrations and FIG. 7 is a graph showing the relationship between the distance Ls and the critical coupling coefficient k(%) of vibrations. In FIGS. 6 and 7, solid lines express the results of the embodiment and broken lines express the results of Comparative Example 1.

Figure 8:
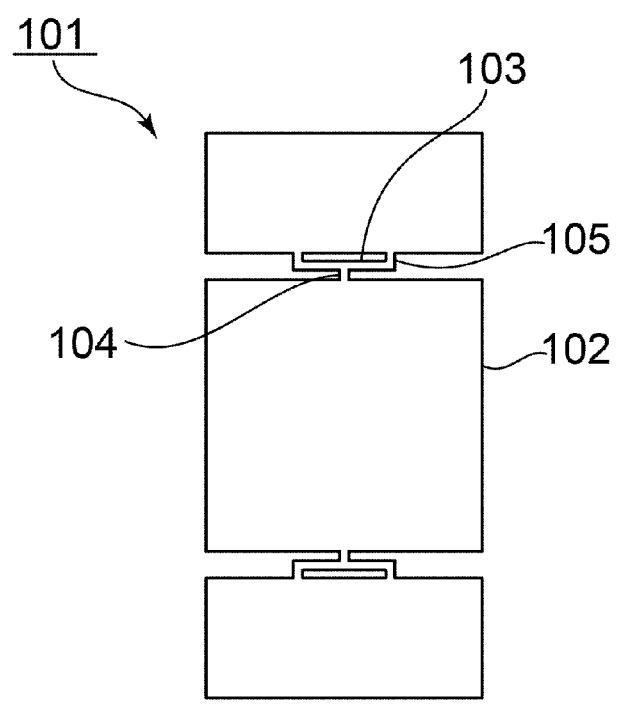
FIG. 8 is a plan view of a vibration device according to Comparative Example 1.

A vibration device 101 illustrated in FIG. 8 was fabricated as Comparative Example 1. Ends of support portions having a length of 5 µm and a width of 5µ were connected to center portions of a pair of opposing side surfaces of a vibration portion 102 having the same dimensions as the vibration portion according to the embodiment. Center portions of bending-vibrating portions 103 having a length of 2Ls+5 µm were connected to the other ends of support portions 104. Both ends of the bending-vibrating portions 103 were connected to a pair of respective outer support portions 105 extending in a direction that is perpendicular to the direction in which the bending-vibrating portions 103 extend and that is a direction away from the vibration portion 102. The width of the outer support portion 105 was determined as 5 µm and the length of the outer support portion 105 was determined as 5 µm. Other portions of the configuration were the same as those of the embodiment. Thus, Comparative Example 1 is different from the above-described embodiment in terms that both ends of each bending-vibrating portion 103 are supported by the corresponding outer support portion 105 having a small area.

As is clear from FIGS. 6 and 7, in the above-described embodiment and Comparative Example 1, Qm and k change when the distance Ls is changed. Particularly, as is clear from FIG. 6, the embodiment can effectively enhance Qm in a wider range than in the case of Comparative Example 1. This is probably because the portions continuous with the fixed ends of each bending-vibrating portion have a larger area. Specifically, this is probably because the acoustic reflection effect is enhanced and the property of confining vibrations is improved.

As is clear from FIGS. 6 and 7, the vibration characteristic changes in accordance with a change of the distance Ls. Particularly, FIG. 6 reveals that Qm is significantly high when the distance Ls is 0.25$\lambda$, which is $\lambda/4$. On the other hand, FIG. 6 also reveals that Qm is significantly low and k is also significantly low when the distance Ls is around 0.5$\lambda$, which is $\lambda/2$.

Thus, since the distance Ls is $\lambda/4$ in this embodiment, a further desirable vibration characteristic can be acquired.

In this embodiment, the distance Ls is determined as $\lambda/4$, but the distance Ls may fall within a range of $\lambda/8$ to $3\lambda/8$. In such a case, a desirable vibration characteristic can be acquired in contrast to the case where the bending-vibrating portions 5 are not provided. In the case where the distance Ls falls within the range of 0.18λ to 0.4λ, the Qm stabilizes at a high value. When the distance Ls falls within this range, the variance of Qm due to the production unevenness can be reduced, whereby vibration devices suitable for mass production can be provided.

As described above, in the vibration device 1 according to the embodiment, the support portions 4 are connected to the portions that move a minimum distance due to the vibrations in the vibration mode in which the square plate expands. In addition, the bending-vibrating portions 5 are disposed at the second ends of the support portions 4. Moreover, the distance Ls in the bending-vibrating portions falls within the specified range so that both ends of the bending-vibrating portions 5 become fixed ends. Thus, vibrations can be securely confined to a region up to the bending-vibrating portions 5, whereby a desirable vibration characteristic can be acquired.

Figure 3:
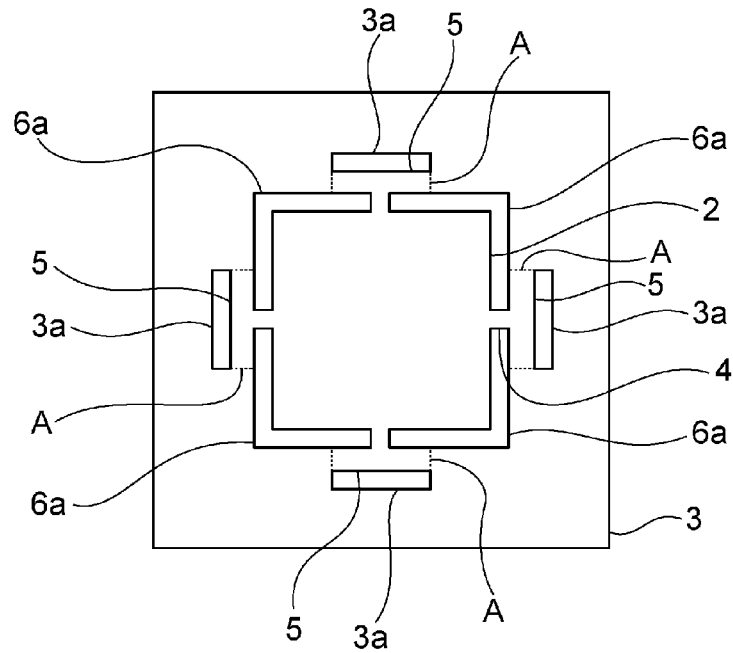
FIG. 3 is a plan view of a vibration device according to a second embodiment of the invention.

In the first embodiment, the bending-vibrating portions 5 are disposed on both sides of a pair of sides of the square-plate-shaped vibration portion 2. However, as in a second embodiment illustrated in FIG. 3, another pair of bending-vibrating portions 5 may be additionally provided by also forming slits 3a on the outer sides of another pair of sides of the square-plate-shaped vibration portion 2. In this case, impact resistance can be enhanced. Thus, the vibration characteristic can be further enhanced.

In the first embodiment and the second embodiment, the square-plate-shaped vibration portion 2 is used. However, as in a vibration device 21 according to a third embodiment illustrated in FIG. 4, a rectangular-plate-shaped vibration portion 2A may be provided, instead. In this case, the rectangular-plate-shaped vibration portion 2A has a rectangular shape having a length and a width. Here, the vibration portion 2A vibrates with width-expanding vibrations that change the width. The invention is also applicable to the vibration device 21 including the vibration portion 2A that uses such a width-expanding vibration mode.

Figure 5:
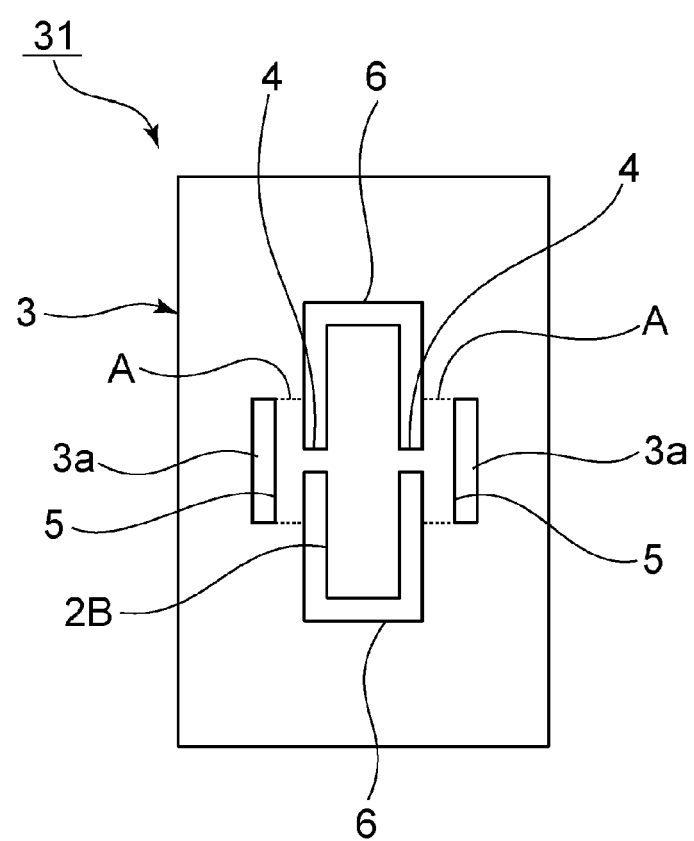
FIG. 5 is a plan view of a vibration device according to a fourth embodiment of the invention.

Still alternatively, as in a vibration device 31 according to a fourth embodiment illustrated in FIG. 5, a vibration portion 2B having a length may be used. In this case, a thin strip-shaped vibration portion 2B is formed and a vibration mode in which the vibration portion 2B expands and contracts in the lengthwise direction is used. Since a vibration node is located at the center of the long side of the vibration portion 2B, the support portions 4 are connected to the node.

Figure 4:
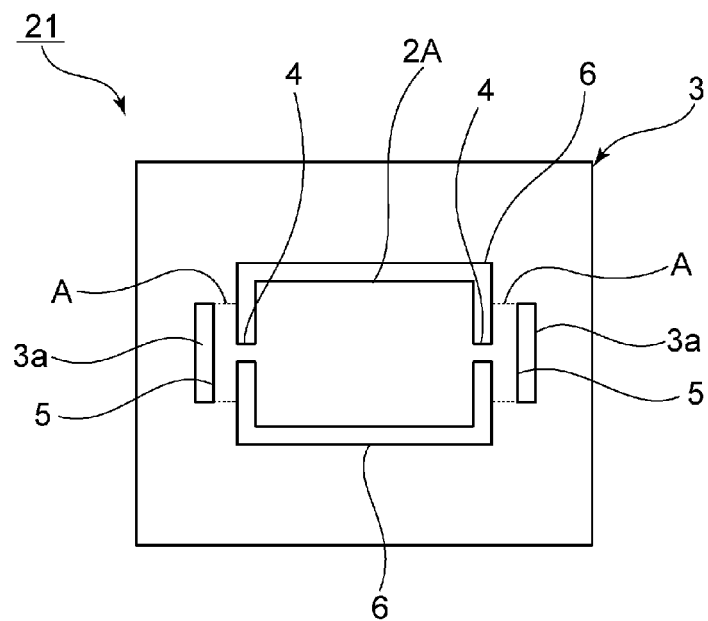
FIG. 4 is a plan view of a vibration device according to a third embodiment of the invention.

As illustrated in FIGS. 4 and 5, the vibration mode used by the vibration portion is not limited to a particular mode in this invention. In the above-described embodiment, the silicon oxide layer 12 is laminated on the Si layer 11, but the silicon oxide layer 12 does not have to be laminated thereon. Nevertheless, the frequency-temperature characteristic can be improved when the silicon oxide layer 12 is laminated thereon. The silicon oxide layer 12 may be disposed on both surfaces of the Si layer 11. In this case, warping of the Si layer can be prevented.

Figure 9:
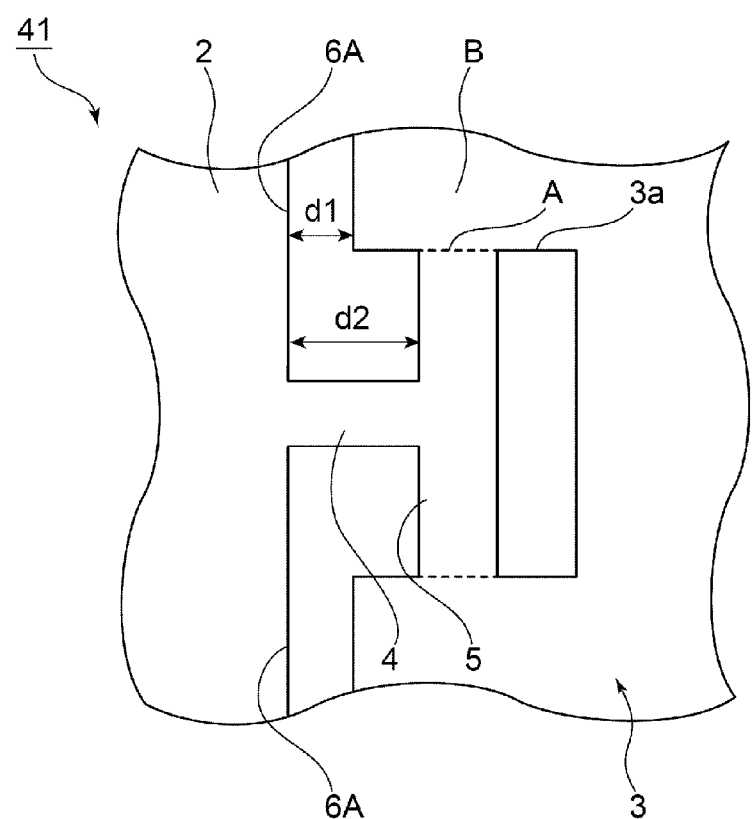
FIG. 9 is a plan view of a vibration device according to a first modified example.

In addition, as in the case of a vibration device 41 according to a first modification example illustrated in FIG. 9, through grooves 6A may be formed in such a manner that a distance d1 between the periphery of the vibration portion 2 and the base portion 3 is smaller than a distance d2 between the periphery of the vibration portion 2 and each bending-vibrating portion 5. In this case, a portion B of the base portion 3 on the outer side of the broken line A denoting the fixed end can have a larger area. Thus, the acoustic reflection effect can be further enhanced. Thus, the property of confining vibrations can be further enhanced.

REFERENCE SIGNS LIST 1 vibration device
2, 2A, 2B vibration portion
3 base portion
3a slit
4 support portion
5 bending-vibrating portion
6, 6A through groove
11 Si layer
12 silicon oxide layer
13 excitation unit
14 piezoelectric thin film
15, 16 first and second electrodes
21 vibration device
31 vibration device
41 vibration device

The invention claimed is:

1. A vibration device, comprising:
  a vibration portion;
  a support portion that includes a first end and a second end opposite to the first end, the first end being connected to the vibration portion;
  a bending-vibrating portion connected to the second end of the support portion; and
  a frame-shaped base portion connected to the bending-vibration portion and disposed so as to surround the vibration portion,
  wherein the frame-shaped base portion defines a slit that extends in a first direction crossing a second direction in which the support portion extends from the vibration portion, the slit defining first and second fixed ends of the bending-vibrating portion which are continuous with the frame-shaped base portion, and a length between a portion of the bending-vibrating portion connected to the second end of the support portion to one of the first and second fixed ends of the bending-vibrating portion is in a range of $\lambda/8$ to $3\lambda/8$, where $\lambda$ denotes a wavelength of a bending vibration corresponding to a frequency of a characteristic vibration of the vibration portion, and
  wherein an entirety of the vibration device is formed of a plate-shaped body and a plurality of through grooves in the plate-shaped body define the vibration portion, the support portion, and the base portion.

2. The vibration device according to claim 1, wherein the length is $\lambda/4$.

3. The vibration device according to claim 1, wherein the length is in a range of $0.18\lambda$ to $0.4\lambda$.

4. The vibration device according to claim 1, wherein a first distance between a periphery of the vibration portion and the base portion is equal to a second distance between the periphery of the vibration portion and the bending-vibrating portion.

5. The vibration device according to claim 1, wherein the support portion is a first support portion, the vibration device further comprising:
  a second support portion that includes a first end and a second end opposite to the first end, the first end being connected to the vibration portion at a location opposite the first support portion; and
  a second bending-vibrating portion connected to the second end of the second support portion, wherein the frame-shaped base is also connected to the second bending-vibration portion.

6. The vibration device according to claim 1, wherein the vibration portion is square-shaped.

7. The vibration device according to claim 1, wherein the vibration portion is rectangular-shaped.

8. A vibration device, comprising:
a vibration portion;
a support portion that includes a first end and a second end opposite to the first end, the first end being connected to the vibration portion;
a bending-vibrating portion connected to the second end of the support portion; and
a frame-shaped base portion connected to the bending-vibration portion and disposed so as to surround the vibration portion,
wherein the frame-shaped base portion defines a slit that extends in a first direction crossing a second direction in which the support portion extends from the vibration portion, the slit defining first and second fixed ends of the bending-vibrating portion which are continuous with the frame-shaped base portion, and a length between a portion of the bending-vibrating portion connected to the second end of the support portion to one of the first and second fixed ends of the bending-vibrating portion is in a range of $\lambda/8$ to $3\lambda/8$, where $\lambda$ denotes a wavelength of a bending vibration corresponding to a frequency of a characteristic vibration of the vibration portion, and
wherein the vibration portion includes a Si layer made of a degenerate semiconductor and an excitation unit on the Si layer, and wherein the excitation unit includes a piezoelectric layer and a first electrode and a second electrode that apply a voltage to the piezoelectric layer.

9. The vibration device according to claim 8, wherein the excitation unit includes a piezoelectric layer, and a first electrode and a second electrode configured to apply a voltage to the piezoelectric layer.

10. The vibration device according to claim 9, wherein the piezoelectric layer is oriented in a thickness direction thereof.

11. The vibration device according to claim 8, wherein the length is $\lambda/4$.

12. The vibration device according to claim 8, wherein the length is in a range of $0.18\lambda$ to $0.4\lambda$.

13. The vibration device according to claim 8, wherein a first distance between a periphery of the vibration portion and the base portion is equal to a second distance between the periphery of the vibration portion and the bending-vibrating portion.

14. The vibration device according to claim 8, wherein the vibration portion is square-shaped.

15. The vibration device according to claim 8, wherein the vibration portion is rectangular-shaped.

16. A vibration device, comprising:
a vibration portion;
a support portion that includes a first end and a second end opposite to the first end, the first end being connected to the vibration portion;
a bending-vibrating portion connected to the second end of the support portion; and
a frame-shaped base portion connected to the bending-vibration portion and disposed so as to surround the vibration portion,
wherein the frame-shaped base portion defines a slit that extends in a first direction crossing a second direction in which the support portion extends from the vibration portion, the slit defining first and second fixed ends of the bending-vibrating portion which are continuous with the frame-shaped base portion, and a length between a portion of the bending-vibrating portion connected to the second end of the support portion to one of the first and second fixed ends of the bending-vibrating portion is in a range of $\lambda/8$ to $3\lambda/8$, where $\lambda$ denotes a wavelength of a bending vibration corresponding to a frequency of a characteristic vibration of the vibration portion, and
wherein a first distance between a periphery of the vibration portion and the base portion is smaller than a second distance between the periphery of the vibration portion and the bending-vibrating portion.

17. The vibration device according to claim 16, wherein the length is $\lambda/4$.

18. The vibration device according to claim 16, wherein the length is in a range of $0.18\lambda$ to $0.4\lambda$.

19. The vibration device according to claim 16, wherein a first distance between a periphery of the vibration portion and the base portion is equal to a second distance between the periphery of the vibration portion and the bending-vibrating portion.

20. The vibration device according to claim 16, wherein the vibration portion is square-shaped.

21. The vibration device according to claim 16, wherein the vibration portion is rectangular-shaped.

22. A vibration device, comprising:
a vibration portion;
a first support portion that includes a first end and a second end opposite to the first end, the first end being connected to the vibration portion;
a first bending-vibrating portion connected to the second end of the first support portion; and
a frame-shaped base portion connected to the first bending-vibration portion and disposed so as to surround the vibration portion, wherein the frame-shaped base portion defines a slit that extends in a first direction crossing a second direction in which the first support portion extends from the vibration portion, the slit defining first and second fixed ends of the first bending-vibrating portion which are continuous with the frame-shaped base portion, and a length between a portion of the first bending-vibrating portion connected to the second end of the first support portion to one of the first and second fixed ends of the first bending-vibrating portion is in a range of $\lambda/8$ to $3\lambda/8$, where $\lambda$ denotes a wavelength of a bending vibration corresponding to a frequency of a characteristic vibration of the vibration portion;
a second support portion that includes a first end and a second end opposite to the first end, the first end being connected to the vibration portion at a location opposite the first support portion; and
a second bending-vibrating portion connected to the second end of the second support portion, wherein the frame-shaped base portion is also connected to the second bending-vibration portion;
a third support portion that includes a first end and a second end opposite to the first end, the first end being connected to the vibration portion at a location between the first support portion and the second support portion;
a third bending-vibrating portion connected to the second end of the third support portion;
a fourth support portion that includes a first end and a second end opposite to the first end, the first end being connected to the vibration portion at a location opposite the third support portion; and a fourth bending-vibrating portion connected to the second end of the third support portion, wherein the frame-shaped base portion is also connected to the third bending-vibration portion and the fourth bending-vibration portion.

\* \* \* \* \*